United States Patent
Djukic et al.

(10) Patent No.: US 7,275,413 B2
(45) Date of Patent: Oct. 2, 2007

(54) METHODS, SYSTEMS, CIRCUITS, AND COMPUTER PROGRAM PRODUCTS FOR DETERMINING POLARIZATION OF A GAS

(75) Inventors: Zivko Djukic, Durham, NC (US); Steve Kadlecek, Carrboro, NC (US); John Nouls, Raleigh, NC (US); Ian Nelson, Chapel Hill, NC (US); Bastiaan Driehuys, Chapel Hill, NC (US)

(73) Assignee: Medi-Physics, Inc., Princeton, NJ (US)

( * ) Notice: Subject to any disclaimer, the term of this patent is extended or adjusted under 35 U.S.C. 154(b) by 0 days.

(21) Appl. No.: 11/280,069

(22) Filed: Nov. 16, 2005

(65) Prior Publication Data

US 2006/0097724 A1 May 11, 2006

Related U.S. Application Data

(62) Division of application No. 10/438,464, filed on May 15, 2003, now Pat. No. 7,127,934.

(60) Provisional application No. 60/381,610, filed on May 17, 2002.

(51) Int. Cl.
*G01N 24/08* (2006.01)

(52) U.S. Cl. .................. 73/23.2; 73/24.06; 324/313; 702/30

(58) Field of Classification Search .............. 73/23.2, 73/24.02, 24.06; 702/30; 324/313
See application file for complete search history.

(56) References Cited

U.S. PATENT DOCUMENTS

| | | | |
|---|---|---|---|
| 5,545,396 A | 8/1996 | Albert et al. | |
| 5,642,625 A | 7/1997 | Cates, Jr. et al. | |
| 5,809,801 A | 9/1998 | Cates, Jr. et al. | |
| 6,002,256 A | 12/1999 | Slade | |
| 6,237,363 B1 | 5/2001 | Zollinger et al. | |
| 6,269,648 B1 | 8/2001 | Hasson et al. | |
| 6,291,994 B1 | 9/2001 | Kim et al. | |
| 6,295,834 B1 | 10/2001 | Driehuys | |
| 6,566,875 B1 * | 5/2003 | Hasson et al. | 324/309 |
| 2001/0025493 A1 | 10/2001 | Hasson et al. | |

FOREIGN PATENT DOCUMENTS

| | | |
|---|---|---|
| EP | 0459064 | 12/1991 |
| JP | 04067844 | 3/1992 |

OTHER PUBLICATIONS

Saam B.T. et.al., "Low Frequency NMR Polarimeter for Hyperpolarized Gases", Journal of Magnetic Resonance, vol. 134, 1998, pp. 67-71.

\* cited by examiner

*Primary Examiner*—Daniel S. Larkin
(74) *Attorney, Agent, or Firm*—Robert F. Chisholm

(57) ABSTRACT

A system for determining polarization of a gas comprises a container that contains the polarized gas. An oscillator circuit comprises an Nuclear Magnetic Resonance (NMR) coil that is positioned adjacent to the container. A pulse generator circuit is configured to generate an electrical pulse that may be transmitted to an optical cell through the NMR coil to excite the polarized gas responsive to a control processor. A Q-reduction circuit that is independent of the pulse generator circuit is configured to reduce oscillations in the oscillator circuit from the transmitted electrical pulse responsive to the control processor. A receive circuit is responsive to an electrical signal that is induced in the oscillator circuit due to the electromagnetic excitation of the polarized gas. The control processor is configured to determine the polarization of the gas based on the output signal of the receive circuit. A polarimetry circuit for determining polarization of a gas includes an NMR coil that may be configured to excite a polarized gas and be responsive to an electromagnetic signal generated by the excited, polarized gas. The polarimetry circuit has a reproducible polarization measurement variability of less than 2% when the NMR coil is exposed to a temperature in a range of about 0° C. to about 200° C. Moreover, circuit-to-circuit polarization measurement variability may be less than about 3%.

24 Claims, 7 Drawing Sheets

METHODS, SYSTEMS, CIRCUITS, AND COMPUTER PROGRAM PRODUCTS FOR DETERMINING POLARIZATION OF A GAS

This application is a divisional of U.S. application Ser. No. 10/438,464 filed May 15, 2003, now U.S. Pat. No. 7,127,934 which claims priority to U.S. application No. 60/381,610 filed May 17, 2002 the entire disclosure of which is hereby incorporated by reference.

FIELD OF THE INVENTION

The present invention relates generally to the field of hyperpolarization of gases, such as noble gases, and, more particularly, to systems, methods, and computer program products for determining the polarization of a hyperpolarized gas.

BACKGROUND OF THE INVENTION

It has recently been discovered that polarized inert noble gases can produce improved MRI images of certain areas and regions of the body, which have heretofore produced less than satisfactory images in this modality. Polarized helium-3 ("$^3$He") and xenon-129 ("$^{129}$Xe") have been found to be particularly suited for this purpose. Unfortunately, the polarized state of the gases may be sensitive to handling and environmental conditions and may, undesirably, decay from the polarized state relatively quickly. Because of the sensitivity of a polarized gas and the potential influence on the strength of the obtained in vivo signal, it is generally desirable to monitor the polarization level of the gas at various times during the product's life. For example, in-process monitoring can indicate the polarization achieved during the optical pumping process or the polarization lost at certain phases of the life cycle process (so as to determine the remaining useable useable polarization of the polarized gas).

Hyperpolarizers are used to produce and accumulate polarized noble gases. Hyperpolarizers artificially enhance the polarization of certain noble gas nuclei (such as $^{129}$Xe or $^3$He) over the natural or equilibrium levels, i.e., the Boltzmann polarization. Such an increase is generally desirable because it enhances and increases the MRI signal intensity, which may allow physicians to obtain better images of the substance in the body. See, e.g., U.S. Pat. No. 5,545,396 to Albert et al., the disclosure of which is hereby incorporated herein by reference as if set forth fully herein in its entirety.

To produce the hyperpolarized gas, the noble gas is typically blended with optically pumped alkali metal vapors such, as rubidium ("Rb"). These optically pumped metal vapors collide with the nuclei of the noble gas and hyperpolarize the noble gas through a phenomenon known as "spin-exchange." The "optical pumping" of the alkali metal vapor is produced by irradiating the alkali-metal vapor with circularly polarized light at the wavelength of the first principal resonance for the alkali metal (e.g., 795 nm for Rb). Generally stated, the ground state atoms become excited, and then subsequently decay back to the ground state. Under a modest magnetic field (10 Gauss), the cycling of atoms between the ground and excited states can yield nearly 100% polarization of the atoms in a few microseconds. This polarization is generally carried by the lone valence electron characteristics of the alkali metal. In the presence of non-zero nuclear spin noble gases, the alkali-metal vapor atoms can collide with the noble gas atoms in a manner in which the polarization of the valence electrons is transferred to the noble-gas nuclei through a mutual spin flip "spin-exchange."

After the spin-exchange has been completed, the hyperpolarized gas is separated from the alkali metal prior to introduction into a patient (to form a non-toxic pharmaceutically acceptable product). Unfortunately, both during and after collection, the hyperpolarized gas can deteriorate or decay relatively quickly (lose its hyperpolarized state) and, therefore, is preferably handled, collected, transported, and stored with care. Proper handling of a hyperpolarized gas is generally important because of the sensitivity of the hyperpolarized state to environmental and handling factors and the potential for undesirable decay of the gas from its hyperpolarized state.

Conventionally, the level of polarization has been monitored at the polarization transfer process point (i.e., at the polarizer or optical cell) in a hyperpolarizer device or measured at a site remote from the hyperpolarizer after the polarized gas is dispensed from the hyperpolarizer. For example, for the latter, the polarized gas is directed to an exit or dispensing port on the hyperpolarizer and into two separate sealable containers, a gas delivery container, such as a bag, and a small (about 5 cubic centimeter) sealable glass bulb specimen container. This glass bulb specimen container may then be sealed at the hyperpolarizer site and carried away from the hyperpolarizer to a remotely located high-field NMR spectroscopy unit (4.7 T) to determine the level of polarization achieved during the polarization process. See, e.g., J. P. Mugler, B. Driehuys, J. R. Brookeman et al., *MR Imaging and Spectroscopy Using Hyperpolarized 129Xe Gas; Preliminary Human Results*, Mag. Reson. Med. 37, 809-815 (1997).

As noted above, conventional hyperpolarizers may monitor the polarization level achieved at the polarization transfer process point, i.e., at the optical cell or optical pumping chamber. To do so, a small "surface" NMR coil may be positioned adjacent to the optical pumping chamber to excite and detect the gas therein and, thus, monitor the level of polarization of the gas during the polarization-transfer process. The small surface NMR coil will typically sample a smaller volume of the proximate polarized gas and thus have a longer transverse relaxation time ($T_2^*$) compared to larger NMR coil configurations. A relatively large tip angle pulse can be used to sample the local-spin polarization. The large angle pulse will generally destroy the local polarization, but because the sampled volume is small compared to the total size of the container, it will not substantially affect the overall polarization of the gas.

Typically, the surface NMR coil is operably associated with low-field NMR detection equipment, which is used to operate the NMR coil and to analyze the detected signals. Examples of low-field NMR detection equipment used to monitor polarization at the optical cell and to record and analyze the NMR signals associated therewith include low-field spectrometers using frequency synthesizers, lock-in amplifiers, audio power amplifiers, and the like, as well as computers.

It is now known that on-board hyperpolarizer monitoring equipment no longer requires high-field NMR equipment, but instead may use low-field detection techniques to perform polarization monitoring for the optical cell at lower field strengths (e.g., 1-100 G) than conventional high-field NMR techniques. This lower field strength allows correspondingly lower detection equipment operating frequencies, such as 1-400 kHz.

For applications where the entire hyperpolarized gas sample can be located inside the NMR coil, an adiabatic fast passage ("AFP") technique has been used to monitor the polarization of the gas in this type of situation. Unfortunately, in many production-oriented situations, this technique is not desirable. For example, to measure the polarization in a one-liter patient dose bag, a relatively large NMR coil and spatially large magnetic field is needed.

These patents are hereby incorporated by reference as if set forth fully herein in their entirety. More recently, Saam et al. has proposed a low-frequency NMR circuit expressly for the on-board detection of polarization levels for hyperpolarized $^3$He at the optical cell inside the temperature-regulated oven, which encloses the cell. See Saam et al., *Low Frequency NMR Polarimeter for Hyperpolarized Gases*, Jnl. of Magnetic Resonance 134, 67-71 (1998). Others have used low-field NMR apparatus for on-board polarization measurement. See, U.S. Pat. No. 6,269,648 to Hasson et al., U.S. Pat. No. 6,237,363 to Zollinger et al., U.S. Pat. No. 6,295,834 to Driehuys, and U.S. Pat. Nos. 5,642,625 and 5,809,801 to Cates et al., the disclosures of which are hereby incorporated herein by reference as if set forth fully herein in their entireties.

The low-frequency NMR detection systems described above notwithstanding, there remains a need for improved methods and/or systems for efficiently and reliably determining and/or monitoring the level of polarization of polarized gases in various points in the production cycle.

SUMMARY OF THE INVENTION

Systems, circuits, and methods, in accordance with various embodiments of the present invention, may determine polarization with a variability less than about 1% over a temperature range of about 0° C. to about 200° C. Moreover, embodiments of the present invention may provide improved reproducibility, as circuit-to-circuit variability may be less than about 3%.

According to certain embodiments of the present invention, a system for determining polarization of a gas comprises a container that is configured to contain the polarized gas. An oscillator circuit comprises an NMR coil that is positioned adjacent to the optical cell. A pulse generator circuit is configured to generate an electrical pulse responsive to the control processor that may be transmitted to the optical cell through the NMR coil to excite the polarized gas. A Q-reduction circuit that is independent of the pulse generator circuit is configured to reduce oscillations in the oscillator circuit from the transmitted electrical pulse responsive to the control processor. A receive circuit is responsive to an electrical signal that is induced in the oscillator circuit due to the procession of the polarized gas spins. The control processor is configured to determine the polarization of the gas based on the output signal of the receive circuit. Advantageously, by controlling the Q-reduction circuit independently of the pulse generator circuit, the Q-value of the oscillator circuit may be rapidly reduced after the completion of the excitation pulse to reduce ringing in the oscillator circuit due to the excitation pulse.

In other embodiments, the pulse generator circuit comprises a pair of diodes that are connected in anti-parallel and are placed in parallel with the oscillator circuit upon the conclusion of the excitation pulse to limit a voltage drop across the oscillator circuit to a conduction voltage of one of the pair of diodes. Like the Q-reduction circuit, the diode pair may serve to reduce ringing in the oscillator circuit due to the excitation pulse. In particular embodiments, each of the diodes may have a leakage current associated therewith that is less than about 1 µA, and in particular embodiments may be about 200 µA or less.

In still other embodiments, the Q-reduction circuit comprises a field effect transistor that is connected in parallel with the oscillator circuit. The oscillator circuit may further comprise a tuning capacitor and a resistor connected in series with the tuning capacitor. The resistor and the tuning capacitor, in combination, are connected in parallel with the NMR coil. The tuning capacitor may have a Q-value of about twenty five times the Q-value of the NMR coil. In some embodiments, the Q-value of the tuning capacitor is greater than about one-thousand. The Q-value of the oscillator circuit may be in a range of about ten to about thirty. The NMR coil may be a precision layer wound NMR coil.

In further embodiments, the receive circuit comprises an amplifier circuit having a gain that is proportional to a ratio of resistance values associated with a first and a second resistor. The first and second resistors may be configured as high precision resistors with about a 1% tolerance or less in some embodiments of the present invention.

In still further embodiments of the present invention, a polarimetry circuit for determining polarization of a gas comprises an NMR coil that may be configured to excite a polarized gas and be responsive to an electromagnetic signal generated by the excited, polarized gas. The polarimetry circuit has a polarization measurement variability of less than 2% when the NMR coil is exposed to a temperature in a range of about 0° C. to about 200° C. Such low variability may be promoted by using high quality and/or tightly-held tolerance circuit components in the polarimetry circuit.

In other embodiments of the present invention, the polarization of a gas may be determined by analyzing a decaying electrical signal that has an initial voltage that is proportional to the polarization of the gas. Intermediate voltage levels corresponding to the voltage levels at intermediate portions of a plurality of time segments are determined. The initial voltage of the decaying electrical signal may then be estimated based on the plurality of intermediate voltage levels. Advantageously, such a methodology for determining the polarization of a gas may be relatively independent of changes in magnetic fields and/or noise that may affect the decaying electrical signal.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS OF THE INVENTION

Figure 1:
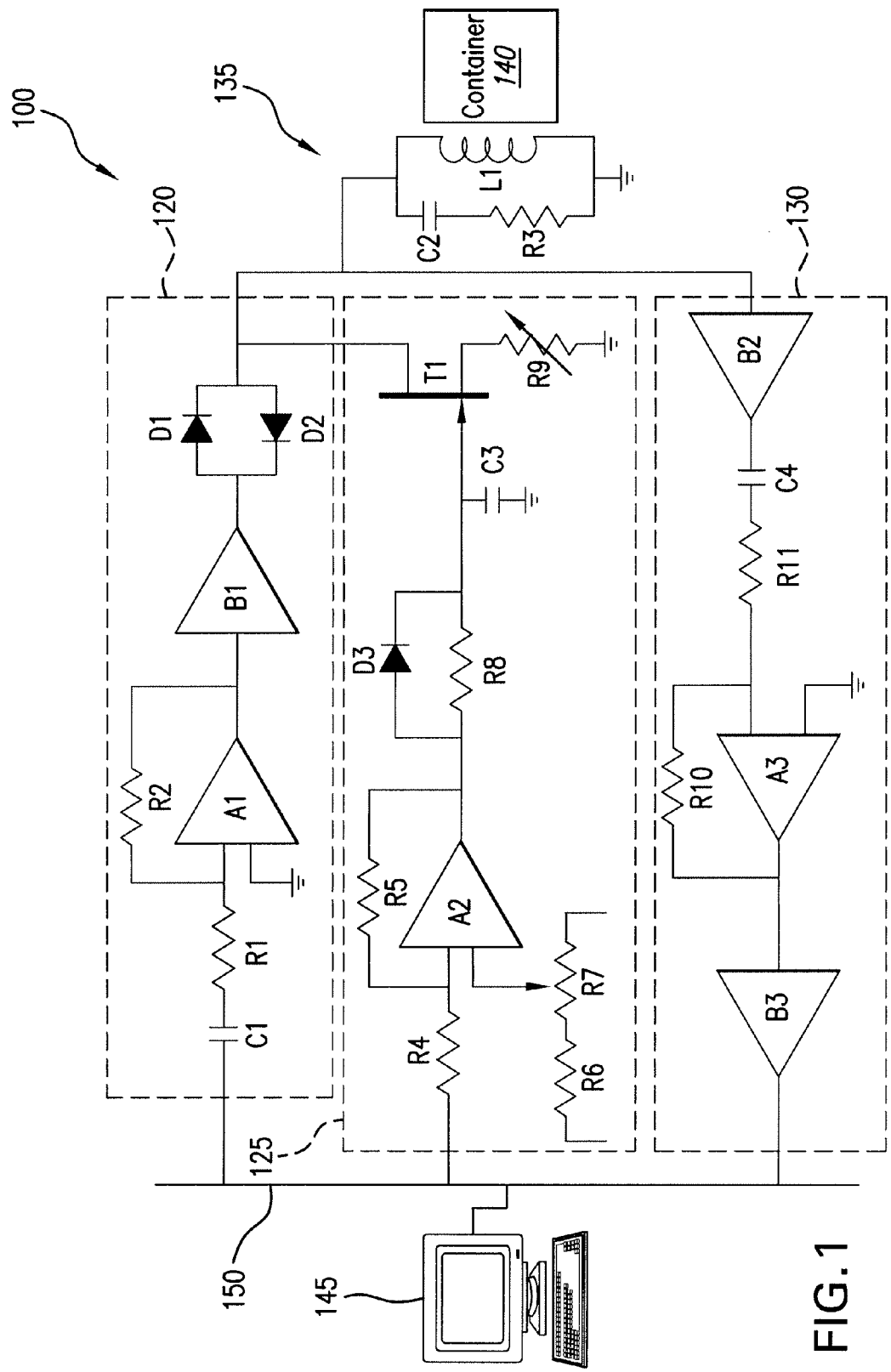
FIG. 1 is a schematic that illustrates systems for determining a polarization of a gas in accordance with some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures. In the figures, components, features, and/or layers may be exaggerated for clarity. Certain features or operations may be illustrated in broken line to indicate such feature or operation is optional.

Various techniques have been used to accumulate and capture polarized gases. For example, U.S. Pat. No. 5,642,625 to Cates et al. describes a high volume hyperpolarizer for spin polarized noble gas and U.S. Pat. No. 5,809,801 to Cates et al. describes a cryogenic accumulator for spin-polarized $^{129}$Xe. These patents are hereby incorporated by reference as if set forth fully herein in their entirety. As used herein, the terms "hyperpolarize," "polarize," and the like are used interchangeably and mean to artificially enhance the polarization of certain noble gas nuclei over the natural or equilibrium levels. Such an increase may be desirable because it may allow stronger imaging signals corresponding to better MRI images of a substance and/or a targeted area of a body. As is known by those of skill in the art, hyperpolarization can be induced by spin-exchange with an optically pumped alkali-metal vapor or alternatively by metastability exchange. See Albert et al., U.S. Pat. No. 5,545,396.

The present invention may be embodied as methods, systems, circuits, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Referring now to FIG. 1, a system 100 for determining the polarization of a gas, in accordance with some embodiments of the present invention, will now be described. The system 100 comprises a pulse generator circuit 120, a Q-reduction circuit 125, and a receive circuit 130, which may be configured as shown. The pulse generator circuit 120, Q-reduction circuit 125, and receive circuit 130, which comprise the components associated by the respective broken line boxes, are connected to an oscillator circuit 135, which is positioned adjacent a container 140 that contains a polarized target gas. The container may comprise a vessel that may hold the polarized target gas and may include, but is not limited to, an optical pumping cell, a baggie, a syringe, an optical pumping cell and oven assembly, etc. In particular embodiments, the target gas may be a noble gas, such as $^{129}$Xe or $^{3}$He. Other target gases and/or noble gases may also be used, alone or in combinations. Buffer gas formulations may also be used as described in the above-incorporated U.S. Pat. No. 6,295,834. The target gas may be polarized, for example, by an optically pumped spin-exchange with a vapor comprising an alkali metal, such as $^{85}$Rb and/or $^{87}$Rb. Other alkali metals may also be used, alone or in combinations. An exemplary list of alkali metals is provided in the above-incorporated U.S. Pat. No. 5,545,396 and U.S. Pat. No. 6,318,092, the disclosure of which is hereby incorporated herein by reference as if set forth fully herein in its entirety. In other embodiments, the target gas may comprise $^{13}$C and/or $^{15}$N compounds, such as organic molecules enriched in $^{13}$C, which may be polarized using dynamic nuclear polarization (DNP) and/or para-hydrogen induced polarization.

The pulse generator circuit 120, Q-reduction circuit 125, and receive circuit 130 are also connected to a control processor 145 via a bus 150. Note that the bus interface is merely exemplary. Other interfaces, including, for example, networked interfaces, wireless interfaces, wireline interfaces, etc., may also be used.

Figure 2:
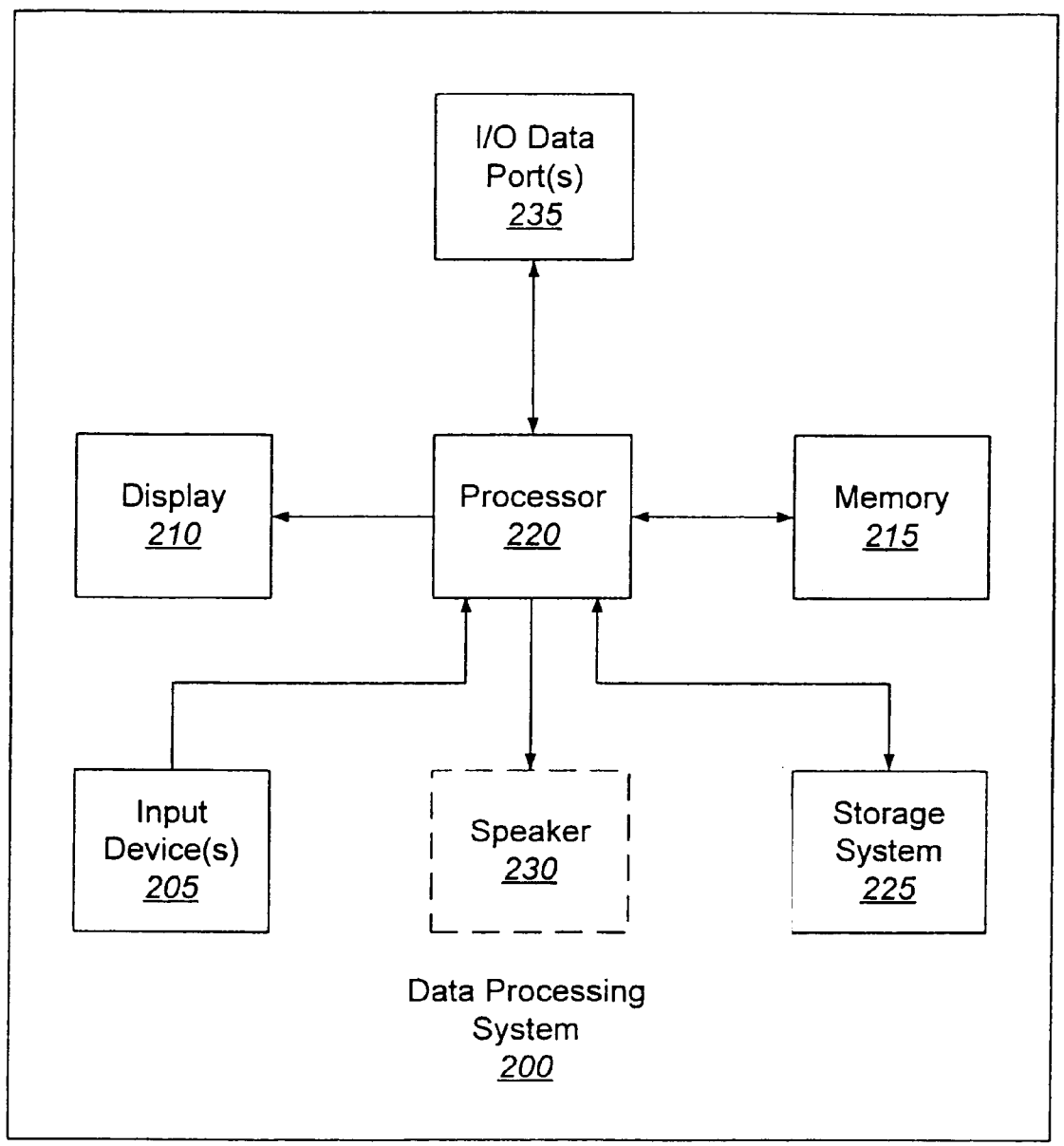
FIG. 2 is a block diagram that illustrates data processing systems that may be used in the systems of FIG. 1 in accordance with some embodiments of the present invention.

In accordance with some embodiments of the present invention, the control processor 145 may be embodied as a data processing system 200 as shown in FIG. 2. The data processing system 200 may include input device(s) 205, such as a keyboard or keypad, a display 210, and a memory 215 that communicate with a processor 220. The data processing system 200 may further include a storage system 225, a speaker 230, and an input/output (I/O) data port(s) 235 that also communicate with the processor 220. The storage system 225 may include removable and/or fixed media, such as floppy disks, ZIP drives, hard disks, or the like, as well as virtual storage, such as a RAMDISK. The I/O data port(s) 235 may be used to transfer information between the data processing system 200 and another computer system or a network (e.g., the Internet). These components may be conventional components such as those used in many conventional computing devices and/or systems, which may be configured to operate as described herein.

It will be further understood, however, that, in accordance with various embodiments of the present invention, the control processor 145 may be embodied as a stand alone computer or data processing system, an embedded processor system, an application specific integrated circuit, a programmed digital signal processor, a microcontroller, and/or the like.

Figure 3:
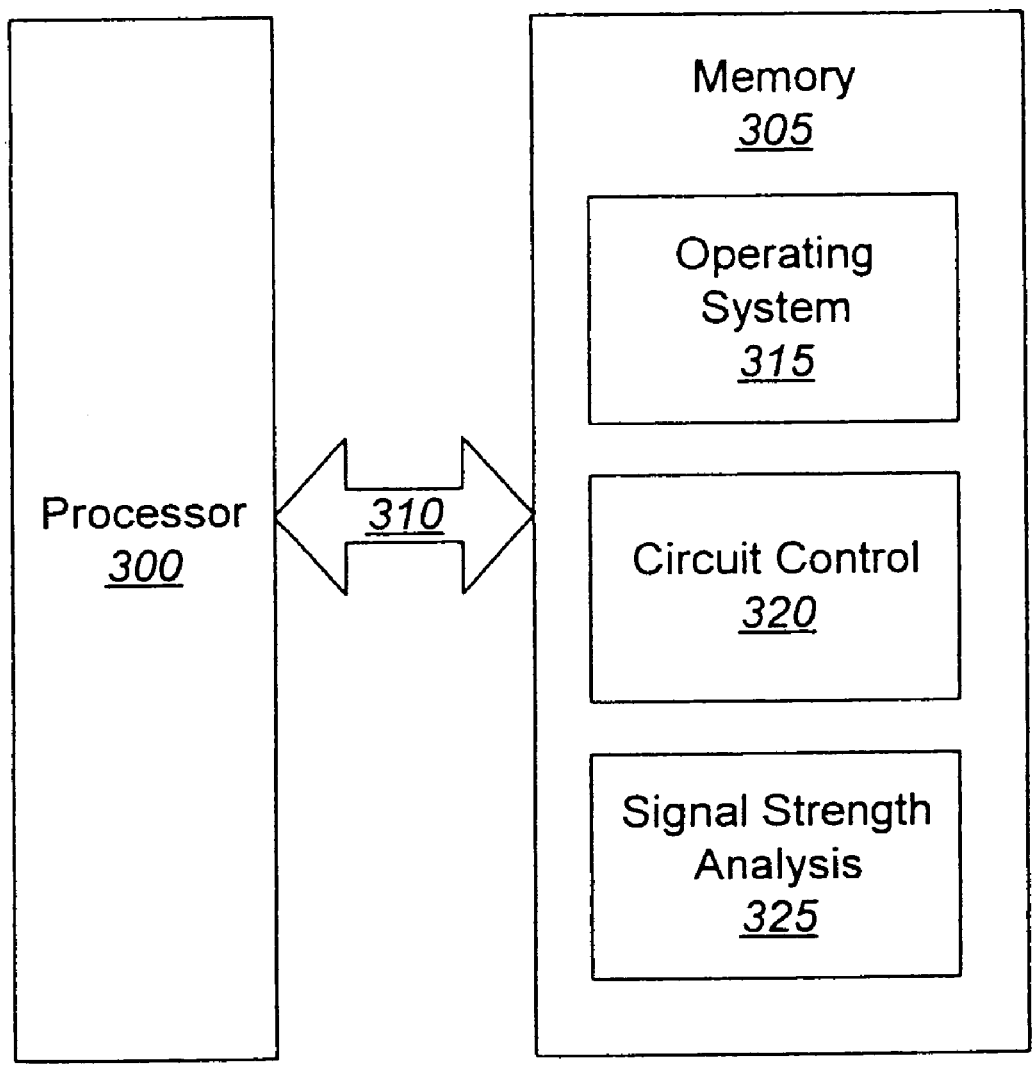
FIG. 3 is a software architecture block diagram that illustrates methods, systems, and computer program products for determining a polarization of a gas in accordance with some embodiments of the present invention.

FIG. 3 illustrates a processor 300 and a memory 305 that may be used in some embodiments to provide the control processor 145 of FIG. 1, in accordance with the present invention. The processor 300 communicates with the memory 305 via an address/data bus 310. The processor 300 may be, for example, a commercially available or custom microprocessor. The memory 305 is representative of the memory devices containing the software and data used to determine the polarization of a gas in accordance with some embodiments of the present invention. The memory 305 may include, but is not limited to, the following types of devices: cache, ROM, PROM, EPROM, EEPROM, flash, SRAM, and DRAM.

As shown in FIG. 3, the memory 305 may contain up to three or more categories of software and/or data: the operating system 315, the circuit control module 320, and the signal strength analysis module 325. The operating system 315 controls the operation of the computer system. In particular, the operating system 315 may manage the computer system's resources and may coordinate execution of programs by the processor 300. The circuit control module 320 may be configured to generate the control signals that are used to drive the pulse generator circuit 120 and the Q-reduction circuit 125 through the bus 150. The circuit control module 320 may also be used to control the reception of signals from the receive circuit 130 through the bus 150. The signal strength analysis module 325 may be configured to process a received signal that is output from the receive circuit 130 to determine the polarization of a gas, in accordance with some embodiments of the present invention, as will be described in detail herein.

Although FIG. 3 illustrates an exemplary software architecture that may be used to determine polarization of a gas, in accordance with some embodiments of the present invention, it will be understood that the present invention is not limited to such a configuration but is intended to encompass any configuration capable of carrying out the operations described herein.

Computer program code for carrying out operations of the present invention may be written in an object-oriented programming language, such as Java, Smalltalk, or C++. Computer program code for carrying out operations of the present invention may also, however, be written in conventional procedural programming languages, such as the C programming language or compiled Basic (CBASIC). Other languages, such as LABVIEW, may also be used. Furthermore, some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Returning to FIG. 1, the pulse generator circuit 120 comprises a capacitor C1 that is connected in series with an amplifier circuit, which comprises an operational amplifier A1 and resistors R1 and R2. The output of the operational amplifier A1 is coupled to a buffer B1 and the output of the buffer B1 is coupled to a pair of diodes D1 and D2 connected in anti-parallel as shown. Thus, in operation, the control processor 145, responsive to the circuit control module 320 (FIG. 3) of the control processor 145, may generate a pulse of predetermined duration and frequency, which is filtered by the capacitor C1 to remove any DC component and then amplified by the operational amplifier A1. The amplified pulse signal exceeds the conduction or threshold voltage of the diode D2 and is, therefore, passed to the oscillator circuit 135.

The oscillator circuit 135 comprises an NMR coil L1, which is connected in parallel with a tuning capacitor C2 and a resistor R3. The tuning capacitor may be a polypropylene capacitor. The NMR coil L1 may comprise 350 turns of 30 AWG (copper) wire wrapped along a center coil-receiving portion. In some embodiments of the present invention, the NMR coil L1 is a precision layer wound NMR coil. Precision layer wound coils may exhibit less than 2% variation in inductance and resistance between coils. An exemplary NMR coil that may be used for determining polarization of a gas is described in U.S. Pat. No. 6,295,834 to Driehuys, the disclosure of which is hereby incorporated herein by reference as if set forth fully herein in its entirety. Other coil configurations, including number of coil turns, may also be used. Typically, the coil will have a sufficient number of turns to yield a desired Q-value for the oscillator circuit 135.

The capacitor C2 is used to tune the oscillator circuit 135 to the detection frequency to facilitate the inducement of an electrical signal in the oscillator circuit 135 due to the electromagnetic signal generated by the polarized gas in the optical cell in response to the pulse generated by the pulse generator circuit 120. The overall Q-value of the oscillator circuit 135 is given by Equation 1 as follows:

$$\frac{1}{Q} = \frac{1}{Q_{cap}} + \frac{1}{Q_{coil}} \qquad \text{EQ. 1}$$

The NMR coil L1 may have a Q-value of about forty. Low-tolerance capacitors, however, may result in significant variability between circuits. Therefore, in some embodiments of the present invention, the tuning capacitor C2 has a Q-value about twenty five times that of the NMR coil to reduce the sensitivity of the oscillator circuit 135 to the tuning capacitor's Q-value. Thus, the tuning capacitor C2 may have a Q-value that is greater than one thousand when the NMR coil L1 has a Q-value of about forty. The resistor R3 may be a high-tolerance (e.g., about 1% variability) resistor to reduce operational variability in the system 100. The high-tolerance resistor R3 may allow the Q-value for the oscillator circuit 135 to be in a range of about ten to about thirty.

Figure 4:
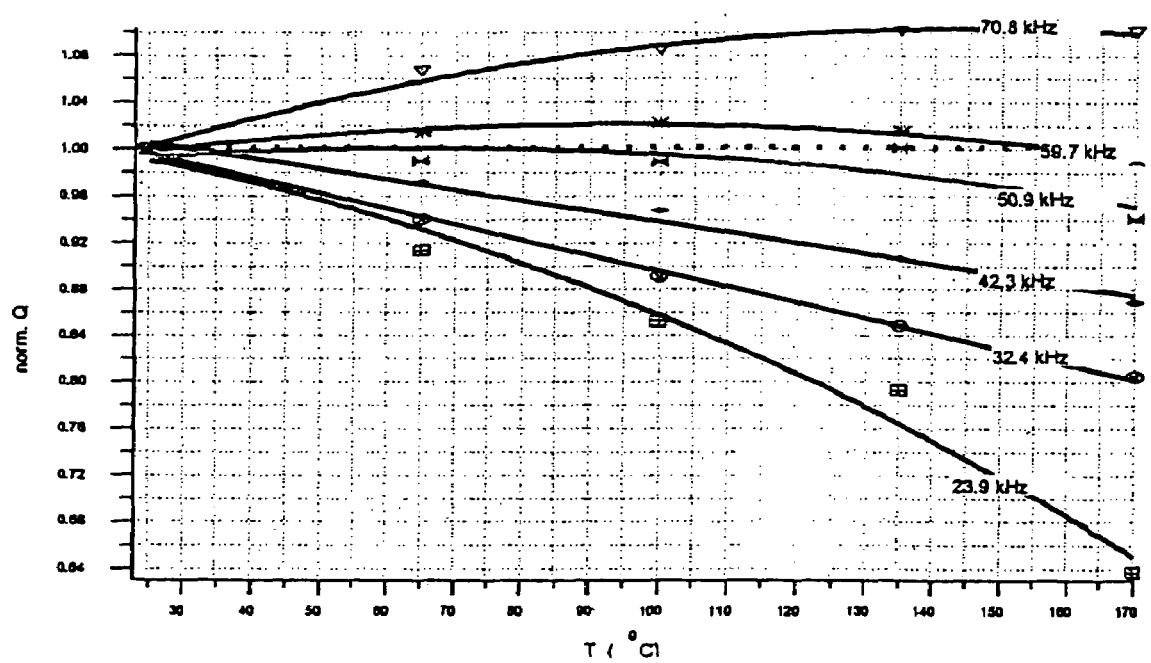
FIG. 4 is a graph of normalized Q-value of the oscillator circuit coil versus temperature for various detection frequencies.

It is generally desirable that the NMR coil L1 be relatively insensitive to variations in temperature. Although it might be expected that the Q-value of the NMR coil L1 would be a decreasing linear function of temperature due to the resistance of the wire increasing, that is not necessarily the case. A frequency dependent effect, sometimes known as the "proximity effect," may limit the Q-value of the NMR coil L1 due to interactions between currents on adjacent winding layers. The proximity effect is generally difficult to calculate; therefore, according to some embodiments of the present invention, the Q-value of the NMR coil L1 can be measured at various frequencies over a range of operating temperatures as shown in FIG. 4. The NMR coil L1 may then be operated at a frequency at which the NMR coil L1 has the least variability in Q-value over the desired operational range of temperatures. In the example shown in FIG. 4, a frequency in a range from about 58 kHz to about 62 kHz is selected as the detection frequency for the NMR coil L1 as the coil is relatively insensitive to temperature variations at these frequencies. For narrower temperature ranges, such as about 20° C. to about 60° C., the detection frequency may be between about 50 kHz and 62 kHz. It will be understood, however, that the frequency range for which the NMR coil L1 has generally lower variability in Q-value is dependent on factors associated with the NMR coil L1, such as the coil diameter and the number of turns.

Returning to FIG. 1, after the conclusion of the pulse by the pulse generator circuit 120, the polarized gas in the container 140 responds with an electromagnetic signal that induces an electrical signal in the oscillator circuit 135. Unfortunately, the oscillator circuit 135 will continue to ring based on the excitation pulse generated by the pulse generator circuit 120 even after the excitation pulse has completed. This ringing may delay the time that the system 100 may begin to process the electrical signal induced in the oscillator circuit 135 by the polarized gas. This delay is sometimes called a "postmute" time. Also, this ringing may be problematic because the initial phase of the ringing is different than that of the excitation pulse, which may inhibit a reliable polarization determination. As a result, the extra tip angles due to the ringing may be additive at some frequencies and subtractive at others. The tip angle applied to atoms resonant at frequency $f_0$ is proportional to the magnitude of the pulse in the frequency domain at $f_0$. Because the atoms' NMR signal is proportional to the sine of the tip angle, a polarimetry circuit may exhibit significant signal variation as a function of detuning the atoms' resonant frequency relative to the transmit frequency. In addition, changes to the pulse frequency and/or duration can change the phase of the ringing relative to that of the transmitted pulse, which may change the way the ringing signal is added to the pulse spectrum and affect the measured response signal.

Moreover, an exemplary signal that is measured may be given by Equation 2:

$$V_{pp} = V_0 e^{\frac{-t_{pm}}{T_2^*}} \qquad \text{EQ. 2}$$

where $T_2^*$ is the transverse relaxation time, $t_{pm}$ is the postmute time, and $V_0$ is the atoms' response signal before $t_{pm}$. It follows that $V_{pp}$ varies with $T_2^*$ as given by Equation 3:

$$\frac{\Delta V_{pp}}{V_{pp}} = \frac{t_{pm}}{T_2^*} \times \frac{\Delta T_2^*}{T_2^*} \qquad \text{EQ. 3}$$

In other words, if $T_2^*$ is $>>t_{pm}$, then $V_{pp}$ may be relatively insensitive to $T_2^*$. Large magnetization in the container 140 may lead to radiation damping, which may add about $100 \text{ s}^{-1}$ to $1/T_2^*$ and affect the precision with which polarization may be determined.

In accordance with various embodiments of the present invention, two techniques may be used, alone or in combination, to reduce ringing in the oscillator circuit 135 and thereby shorten the postmute time. The first technique involves the use of the diodes D1 and D2 in the pulse generator circuit 120. After the completion of the excitation pulse, the diodes D1 and D2 are effectively placed in parallel with the oscillator circuit, which limits the voltage drop across the oscillator circuit 135 to the value of the conduction voltage of diodes, which may be about 0.6 V.

The diodes D1 and D2 may also serve to decouple the pulse generator circuit 120 from the oscillator circuit 135. In reality, however, some "leakage current" i flows through the diodes even for voltages V less than the conduction voltage of the diodes. This leakage current i is given Equation 4 below:

$$i = I_s(e^{\frac{Ve}{kT}} - 1), \qquad \text{EQ. 4}$$

where e is the electron charge, kT is the thermal energy, and $I_s$ is the diode's reverse saturation current. When receiving the response from the gas in the container 140, the diodes D1 and D2 are in parallel with the tuning capacitor C2 and the NMR coil L1, which has inductance L and resistance R. The leakage current siphons energy from the tuned oscillator circuit 135 and, therefore, limits the Q value of the oscillator circuit 135. The Q-value may be approximately limited as set forth in Equation 5 below:

$$Q = \frac{Q_0}{1 + \frac{L}{RC}I_s\frac{e}{kT}}, \qquad \text{EQ. 5}$$

where $Q_0$ is the quality factor of the oscillator circuit in the absence of the diodes D1 and D2. As can be seen from Equation 5, it is generally desirable to select diodes D1 and D2 having generally low leakage current values associated therewith. In accordance with some embodiments of the present invention, the diodes D1 and D2 have leakage currents that are less than about 1 µA. In particular embodiments of the present invention, the diodes D1 and D2 have leakage currents of about 200 nA or less.

A second technique to reduce the ringing in the oscillator circuit 135 due to the excitation pulse involves use of the Q-reduction circuit 125. The Q-reduction circuit comprises an amplifier circuit that includes an operational amplifier A2 along with resistors R4 and R5. Resistors R6 and R7 are used to set a reference potential for the operational amplifier A2. A diode D3 and a resistor R8 are connected in parallel with each other and are each connected between an output terminal of the operational amplifier A2 and a gate terminal of a junction field effect transistor (JFET) T1. A capacitor C3 is connected between the gate terminal of the JFET T1 and a reference potential, e.g., ground.

Figure 5A:
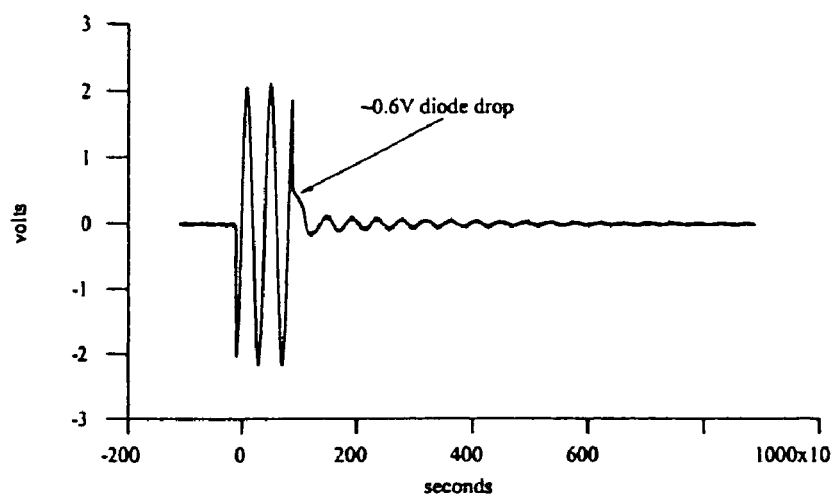
FIG. 5A is a graph of an excitation pulse and induced ringing received in response thereto for embodiments of the present invention in which a Q-reduction circuit is not used.
Figure 5B:
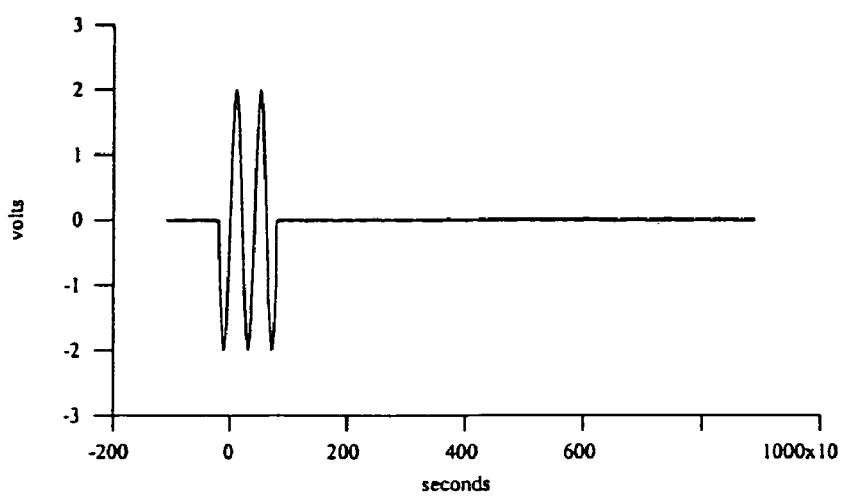
FIG. 5B is a graph of an excitation pulse and induced ringing received in response thereto for embodiments of the present invention in which a Q-reduction circuit is used.

In response to a signal initiated by the circuit control module 320 of the control processor 145, the operational amplifier A2 generates a pulse that is passed by the diode D3 to the gate of the JFET T1 to turn the JFET T1 on. In more detail, normally the voltage between the gate and source of the JFET T1 is kept below the pinch-off voltage of the JFET to keep the JFET T1 in an open state. Immediately following transmission of the excitation pulse by the pulse generator circuit 120, the voltage between the gate and the source of the JFET T1 is driven at least one voltage above the pinch-off voltage for a short duration, e.g., approximately 0.05 ms, by a square pulse at the output of the operational amplifier A2. The diode D3 may allow the voltage at the gate of the JFET T1 to rise relatively quickly to turn on the JFET T1. When the JFET T1 is in the "on" state, it may be modeled as a relatively small, e.g., 100 ohm, resistor in parallel with the oscillator circuit 135. As a result, the Q-value of the oscillator circuit is significantly reduced along with the ringing in the oscillator circuit 135. In particular embodiments, the resistor R9 may be set such that oscillations in the oscillator circuit 135 are critically damped. FIGS. 5A and 5B illustrate a transmitted excitation pulse and response signal without the use of the Q-reduction circuit 125 (FIG. 5A) and with the use of the Q-reduction circuit (FIG. 5B).

At the end of the square pulse, the voltage at the gate of the JFET T1 is allowed to drop below the pinch-off voltage, thereby turning off the JFET T1. The voltage at the gate of the JFET T1 decays according to the time constant τ=R8C3. Advantageously, any charge injected into the tuning capacitor C2 due to capacitance between the gate and the source of the JFET T1 may be injected immediately after the excitation pulse when such a glitch may be inconsequential. Moreover, the JFET T1 is turned off slowly based on the time constant τ=R8C3 after the ringing has damped down. Through use of the Q-reduction circuit 125 and the diodes D1 and D2, the postmute time may be reduced to approximately 0.15 ms or less in some embodiments. Moreover, operations of the Q-reduction circuit 125, including timing and shaping of the pulse, may be controlled using a stored program running on a processor. This may allow operations of the Q-reduction circuit 125 to be adjusted for particular gases.

The receive circuit 130 comprises a buffer B2 having an output terminal that is connected to an amplifier circuit by a capacitor C4. The amplifier circuit comprises an operational amplifier A3 along with resistors R10 and R11. The output of the operational amplifier A3 is connected to a buffer B3, which has an output connected to the bus 150. The capacitor C4 may be used to block any DC component in the response signal induced in the oscillator circuit 135 due to excitation of the polarized gas in the container 140. The operational amplifier A3 is configured to amplify the induced signal in the oscillator circuit and provide the amplified signal to the control processor for processing. In some embodiments of the present invention, the resistors R10 and R11, which determine the gain of the operational amplifier A3, have about 1% tolerance.

Table 1 below provides a list of exemplary values for the circuit components of FIG. 1.

TABLE 1

| C1  | .022 μF  |
|-----|----------|
| R1  | 1 kΩ     |
| R2  | 1 kΩ     |
| R3  | 3.3 Ω    |
| C2  | 22 nF    |
| R4  | 1 kΩ     |
| R5  | 1.5 kΩ   |
| R6  | 10 kΩ    |
| R7  | 100 kΩ   |
| R8  | 100 kΩ   |
| C3  | 1.2 nF   |
| R9  | 500 Ω    |
| R10 | 28 kΩ    |
| R11 | 88.7 Ω   |
| C4  | 0.1 μF   |

Although FIG. 1 illustrates an exemplary system architecture for determining a polarization of a gas, it will be understood that the present invention is not limited to such a configuration but is intended to encompass any configuration capable of carrying out the operations described herein.

The present invention is described hereinafter with reference to flowchart and/or block diagram illustrations of methods, systems, and computer program products in accordance with exemplary embodiments of the invention. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

With reference to the flowcharts of FIGS. 6 and 8, exemplary operations of methods, systems, circuits, and computer program products for determining polarization of a gas, in accordance with some embodiments of the present invention, will be described hereafter.

Figure 6:
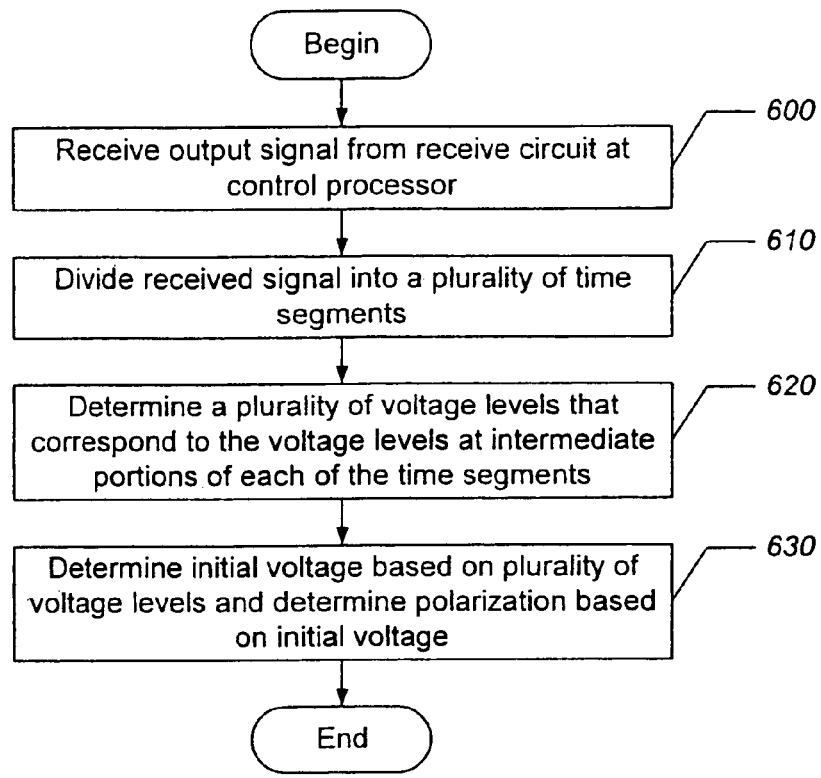
FIG. 6 is a flowchart that illustrates exemplary operations for determining a polarization of a gas in accordance with some embodiments of the present invention.
Figure 7:
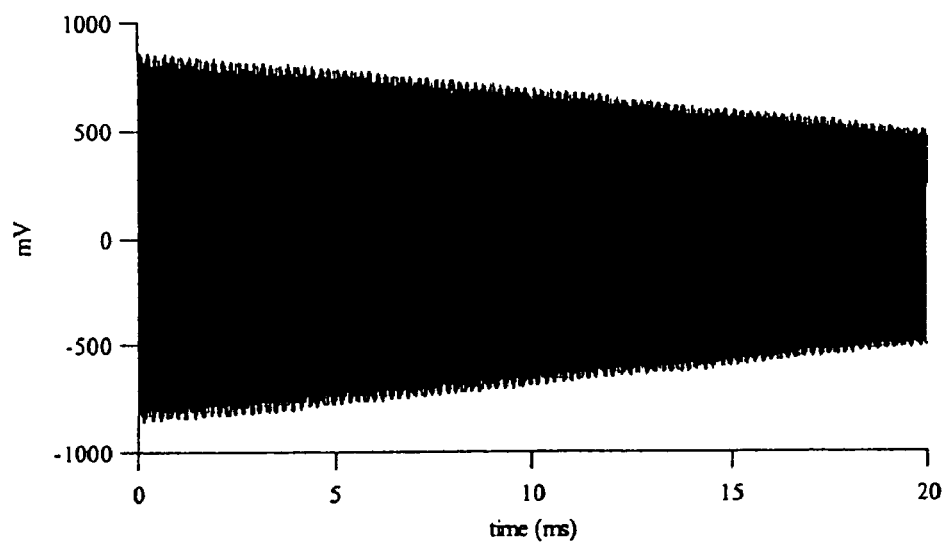
FIG. 7 is a graph that illustrates a decaying electrical signal that is received in response to excitation of a polarized gas.

Referring now to FIG. 6, operations begin at block 600 where the control processor 145 receives the output signal from the receive circuit 130, which is a decaying electrical signal that has an initial voltage that is proportional to the polarization of the gas in the container 140. An exemplary output signal from the receive circuit 130 is shown in FIG. 7. Recall, however, that although the present invention may allow the postmute time to be reduced over that of conventional polarimetry circuits, the postmute time is non-zero. As a result, the initial voltage is not measured directly, but is instead determined by the signal strength analysis module 325. The received signal may be expressed as set forth below in Equation 6:

$$V(t) = V_0 g(t)\sin(2\pi f t + \phi) + \text{Noise}(t), \quad \text{EQ. 6}$$

where $V_0$ is the initial voltage and $g(t)$ may be represented by Equation 7 below:

$$g(t) = e^{-\left(\frac{t}{A}\right)^B}, \quad \text{EQ. 7}$$

wherein A is a time constant associated with the gas and $1 \leq B \leq 2$. When B=1 and the received signal may be represented as an exponential function, the time constant A may be equal to the transverse relaxation time $T_2^*$ of the gas.

Unfortunately, g(t) is generally dependent on the polarization of the sample as well as ambient magnetic field gradients. It is generally desirable that the signal analysis be relatively independent of g(t), φ, and noise(t). Therefore, according to some embodiments of the present invention, the received signal can be divided into a plurality of time segments at block 610. At block 620, a plurality of intermediate voltage levels that correspond to the voltage levels of the received signal at intermediate portions of the time segments are determined. The initial voltage of the received signal is then determined using curve-fitting techniques, such as a least squares fit, on the intermediate voltage levels. At block 630, the polarization is determined based on the initial voltage of the received signal.

Figure 8:
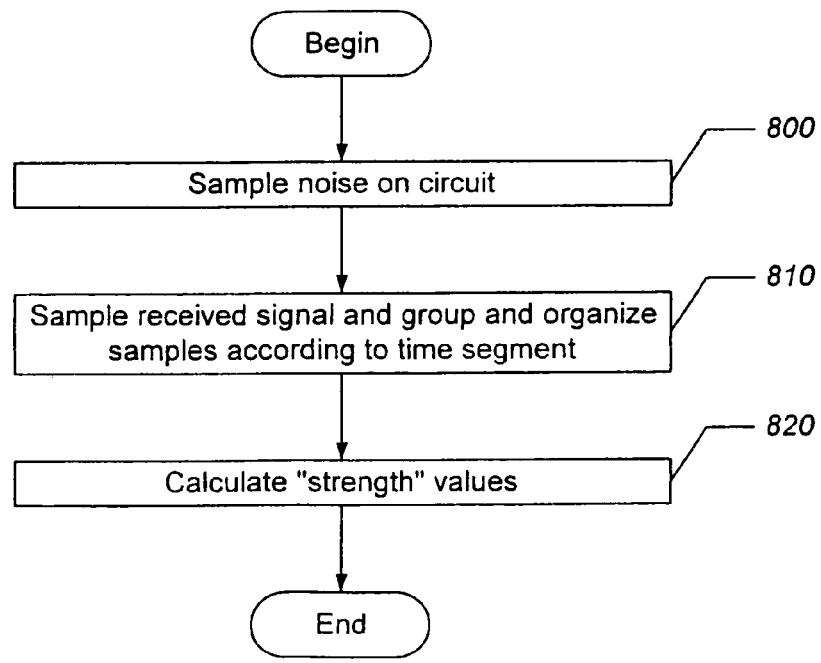
FIG. 8 is a flowchart that illustrates further exemplary operations for determining a polarization of a gas in accordance with some embodiments of the present invention.

Exemplary operations for determining the plurality of intermediate voltage levels, according to some embodiments of the present invention, are illustrated in FIG. 8. Operations begin at block 800 where the noise on the circuit is sampled before initiating operations for measuring polarization of a gas in the container 140. The received signal is also sampled at block 810 and the samples are grouped into the time segments discussed above to create a plurality of noise sub-arrays and signal sub-arrays corresponding to the samples in the various time segments. For each signal and noise sub-array pair corresponding to a signal time segment a "strength" value is determined that is proportional to the value $V_0 g(t)$ at an intermediate portion of the time segment. The values $strength_k$ may, therefore, be calculated as expressed below in Equation 8 at block 820:

$$strength_k = \sqrt{2 \times \sum_i \left[ (signal_i^k)^2 - (noise_i^k)^2 \right] \Delta t}, \quad \text{EQ. 8}$$

wherein Δt is a time difference between samples, $signal_i^k$ are $signal_i$ samples in time segment k, and $noise_i^k$ are $noise_i$ samples in time interval k. The noise array $noise_i^k$ may be the actual sampled noise array or, advantageously, the sampled noise array may be replaced by a pseudo-randomly generated array of points whose values fall into a gaussian distribution with a root mean square value equal to that of the sampled noise array. The length of each time segment may be adjusted to ensure a suitable number of cycles of the received signal are captured. If the received signal decays relatively rapidly, then a shorter time segment may be preferred. If the received signal decays relatively slowly, then a longer time segment may be preferred.

Figure 9:
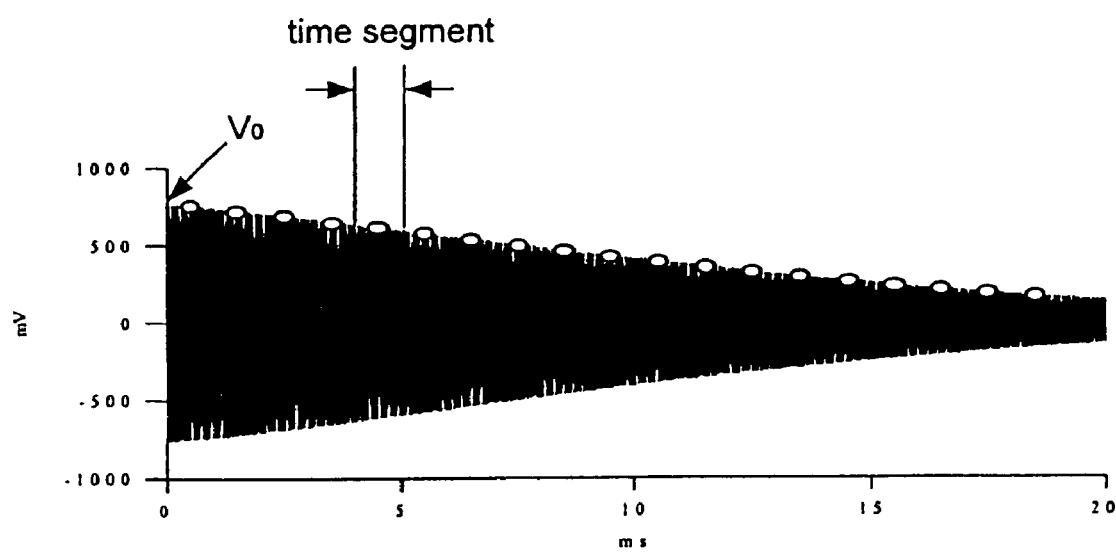
FIG. 9 is a graph that illustrates a determination of an initial voltage of the signal induced by the excited polarized gas based on the determination of a plurality of intermediate voltage levels in accordance with some embodiments of the present invention.

As shown in FIG. 9, the values at intermediate portions of each segment may be plotted (shown by ellipticals on top of the curve) and a least squares fit performed to determine the value $V_0$. The polarization of the gas in the container 140 is proportional to the value $V_0$ and, therefore, may be computed therefrom. The proportionality constant may be determined by performing a polarization determination for a gas with a known polarization.

Advantageously, due to precision components used in the system 100 for determining the polarization of a gas, the system 100 may determine polarization with a variability less than about 2% when the NMR coil is exposed to a temperature in a range of about 0° C. to about 200° C. In some embodiments, the system 100 may determine polarization with a variability less than about 1% when the NMR coil is exposed to a temperature in a range of about 0° C. to about 200° C. Moreover, the architecture may provide improved reproducibility as circuit-to-circuit variability may be less than about 3%. The system 100 is also configurable to facilitate polarization determinations for different gases by, for example, adjusting circuit values, circuit timing, detection frequency, etc.

The flowcharts of FIGS. 6 and 8 illustrate the architecture, functionality, and operations of embodiments of the system 100 software. In this regard, each block represents a module, segment, or portion of code, which comprises one or more executable instructions for implementing the specified logical function(s). It should also be noted that in some alternative implementations, the function(s) noted in the blocks may occur out of the order noted in FIGS. 6 and 8. For example, two blocks shown in succession may, in fact, be executed substantially concurrently or the blocks may sometimes be executed in the reverse order, depending on the functionality involved.

Many variations and modifications can be made to the preferred embodiments without substantially departing from the principles of the present invention. All such variations and modifications are intended to be included herein within the scope of the present invention, as set forth in the following claims. In the claims, means-plus-function clauses are intended to cover the structures described herein as performing the recited function and not only structural equivalents, but also equivalent structures.

The invention claimed is:

1. A method of determining a polarization of a gas, comprising the steps of:
    transmitting an electromagnetic pulse through an NMR coil circuit to excite the gas;
    inducing an electrical signal in the NMR coil circuit in response to the excitation of the gas, the induced electrical signal having an initial voltage that is proportional to the polarization of the gas;
    reducing oscillations in the NMR coil circuit from the transmitted electromagnetic pulse in response to a control signal that is independent of the electromagnetic pulse; and
    processing the induced electrical signal to determine the polarization of the gas.

2. The method of claim 1, wherein reducing oscillations in the NMR coil circuit comprises the step of:
    critically damping oscillations in the NMR coil circuit.

3. The method of claim 1, wherein processing the induced electrical signal, comprises the steps of:
    amplifying the induced electrical signal to generate an amplified signal;
    determining a plurality of intermediate voltage levels, the plurality of intermediate voltage levels corresponding to voltage levels of the amplified signal at intermediate portions of a plurality of time segments; and
    estimating the initial voltage of the induced electrical signal based on the plurality of intermediate voltage levels.

4. The method of claim 3, wherein determining the plurality of intermediate voltage levels, comprises the steps of:
    sampling a noise signal to obtain a plurality of samples $noise_i$;
    sampling the amplified signal to obtain a plurality of samples $signal_i$; and
    calculating a plurality of strength values, $strength_k$, corresponding to respective ones of the plurality of time segments as follows:

$$strength_k = \sqrt{2 \times \sum_i [((signal_i^k)^2 - (noise_i^k)^2)\Delta t]},$$

wherein Δt is a time difference between samples, $signal_i^k$ are $signal_i$ samples in time segment k, and $noise_i^k$ are $noise_i$ samples in time segment k.

5. The method of claim 1, wherein the induced electrical signal has an associated voltage over time g(t) as follows:

$$g(t) = e^{-\left(\frac{t}{A}\right)^B},$$

wherein A is a time constant associated with the gas and $1 \leq B \leq 2$.

6. The method of claim 1, wherein the gas comprises at least one of $^{129}Xe$, $^3He$, $^{13}C$ compounds, and $^{15}N$ compounds.

7. A system for determining a polarization of a gas, comprising:
a container that is configured to contain a polarized gas;
an oscillator circuit comprising a Nuclear Magnetic Response (NMR) coil that is adjacent to an optical cell;
a control processor;
a pulse generator circuit that is configured to generate an electrical pulse responsive to the control processor that is transmitted to the optical cell through the NMR coil to excite the polarized gas;
a Q-reduction circuit that is independent of the pulse generator circuit and is configured to reduce oscillations in the NMR coil from the transmitted electrical pulse responsive to the control processor;
a receive circuit that is responsive to an electrical signal induced in the oscillator circuit due to electromagnetic excitation of the polarized gas; and
the control processor being configured to determine the polarization of the gas based on an output signal of the receive circuit.

8. The system of claim 7, wherein the pulse generator circuit comprises:
a pair of diodes connected in anti-parallel and are placed in parallel with the oscillator circuit upon conclusion of the electrical pulse to limit a voltage drop across the oscillator circuit to a conduction voltage of one of the pair of diodes.

9. The system of claim 8, wherein each of the pair of diodes has a leakage current associated therewith that is less than about 1 μA.

10. The system of claim 9, wherein each of the pair of diodes has a leakage current associated therewith that is approximately 200 nA.

11. The system of claim 7, wherein the Q-reduction circuit comprises a field effect transistor that is connected in parallel with the oscillator circuit.

12. The system of claim 11, wherein the Q-reduction circuit further comprises:
a capacitor connected between a gate terminal of the field effect transistor and a reference potential;
an amplifier circuit having an input terminal that is connected to the control processor;
a resistor connected between the gate terminal of the field effect transistor and an output terminal of an amplifier circuit; and
a diode connected in parallel with the resistor.

13. The system of claim 7, wherein the oscillator circuit comprises:
a tuning capacitor; and
a resistor connected in series with the tuning capacitor, the resistor and the tuning capacitor connected in parallel with the NMR coil.

14. The system of claim 13, wherein the tuning capacitor has a Q-value about 25 times the Q-value of the NMR coil.

15. The system of claim 13, wherein the tuning capacitor has a Q-value greater than about 1000.

16. The system of claim 13, wherein the oscillator circuit has a Q-value in a range of about 10 to about 30.

17. The system of claim 7, wherein the receive circuit comprises:
an amplifier circuit having a gain that is proportional to a ratio of resistance values associated with a first resistor and a second resistor.

18. The system of claim 17, wherein the first and the second resistors have about a 1% variability tolerance.

19. The system of claim 7, wherein the NMR coil is a precision layer wound NMR coil.

20. The system of claim 7, wherein a frequency of the electrical signal induced in the oscillator is associated with a frequency at which a Q-value of the NMR coil is substantially independent of temperature between about 30° C. and about 200° C.

21. The system of claim 7, wherein the frequency of the electrical signal induced in the oscillator is about 61 kHz.

22. The system of claim 7, wherein the control processor comprises:
means for analyzing the output signal of the receive circuit, the output signal having an initial voltage that is proportional to the polarization of the gas;
means for determining a plurality of intermediate voltage levels, the intermediate voltage levels corresponding to voltage levels of the output signal at intermediate portions of a plurality of time segments;
means for determining the initial voltage of the output signal based on the plurality of intermediate voltage levels; and
means for determining the polarization based on the initial voltage.

23. The system of claim 22, wherein the means for determining the plurality of intermediate voltage levels, comprises:
means for sampling a noise signal to obtain a plurality of samples $noise_i$;
means for sampling the output signal to obtain a plurality of samples $signal_i$; and
means for calculating a plurality of strength values, $strength_k$, each corresponding to a respective time segment as follows:

$$strength_k = \sqrt{2 \times \sum_i [((signal_i^k)^2 - (noise_i^k)^2)\Delta t]},$$

wherein Δt is a time difference between samples, $signal_i^k$ are $signal_i$ samples in time segment k and $noise_i^k$ are $noise_i$ samples in time segment k.

24. The system of claim 7, wherein the gas comprises at least one of $^{129}Xe$, $^3He$, $^{13}C$ compounds, and $^{15}N$ compounds.

* * * * *